*US007880538B2*

(12) United States Patent
Sharma

(10) Patent No.: US 7,880,538 B2
(45) Date of Patent: Feb. 1, 2011

(54) SWITCHED-CAPACITOR AMPLIFIER ARRANGEMENT AND METHOD

(75) Inventor: Vivek Sharma, Olten (CH)

(73) Assignee: Austriamicrosystems AG, Unterpremstätten (AT)

( * ) Notice: Subject to any disclaimer, the term of this patent is extended or adjusted under 35 U.S.C. 154(b) by 32 days.

(21) Appl. No.: 12/084,819

(22) PCT Filed: Oct. 26, 2006

(86) PCT No.: PCT/EP2006/010347

§ 371 (c)(1),
(2), (4) Date: Mar. 2, 2009

(87) PCT Pub. No.: WO2007/054209

PCT Pub. Date: May 18, 2007

(65) Prior Publication Data

US 2009/0167430 A1 Jul. 2, 2009

(30) Foreign Application Priority Data

Nov. 8, 2005 (EP) .................................. 05024342

(51) Int. Cl.
*H03F 1/02* (2006.01)
(52) U.S. Cl. ........................................................ 330/9
(58) Field of Classification Search ...................... 330/9, 330/107; 327/124
See application file for complete search history.

(56) References Cited

U.S. PATENT DOCUMENTS 4,315,227 A  2/1982  Fleischer et al.

6,452,531 B1  9/2002  Miller et al.
6,924,760 B1  8/2005  McLeod et al.
2007/0001757 A1* 1/2007  Josefsson ...................... 330/9

FOREIGN PATENT DOCUMENTS

EP        0 096 857       12/1983
WO      WO 97/06601       2/2007

OTHER PUBLICATIONS

Ludwig G.A. Callewaert, et al., "Class AB CMOS Amplifiers with High Efficiency", IEEE Journal of Solid State Circuits, vol. 25, No. 3, pp. 684-691, Jun. 1990.
Klaas-Jan de Langen et al., "Compact Low-Voltage Power-Efficient Operational Amplifier Cells for VLSI", IEEE Journal of Solid-State Circuits, vol. 33, No. 10, pp. 1482-1496, Oct. 1998.
R. Klinke et al., "A Very-High-Slew-Rate CMOS Operational Amplifier", IEEE Journal of Solid-State Circuits, vol. 24, No. 3, pp. 744-746, Jun. 1989.
Antonio J. Lopez Martin, et al., "Low-Voltage Super Class AB CMOS OTA Cells with Very High Slew Rate and Power Efficiency", IEEE Journal of Solid-State Circuits, vol. 40, No. 5, pp. 1068-1077, May 2005.

* cited by examiner

*Primary Examiner*—Steven J Mottola
(74) *Attorney, Agent, or Firm*—Cohen Pontani Lieberman & Pavane LLP

(57) ABSTRACT

A switched-capacitor amplifier arrangement and a method to amplify a signal are presented. A forward path has at least one switched capacitor (10) controlled by a clock signal, thus providing an amplification phase (1) of the forward path and an additional clock phase (2). A damping means (22) is connected to the forward path, the damping means being designed for attenuation of the signal peak at the beginning (2p) of the amplification phase. This avoids an undesired feed forward effect at the beginning of the amplification phase of an SC circuit.

17 Claims, 6 Drawing Sheets

SWITCHED-CAPACITOR AMPLIFIER ARRANGEMENT AND METHOD

RELATED APPLICATIONS

This is a U.S. national stage of application No. PCT/EP2006/010347, filed on 26 Oct. 2006.

This application claims the priority of European application no. 05024342.7 filed Nov. 8, 2005, the entire content of which is hereby incorporated by reference.

FIELD OF THE INVENTION

The present invention relates to a switched-capacitor amplifier arrangement and to a method to amplify a signal.

BACKGROUND OF THE INVENTION

Switched-capacitor, SC amplifiers are widely used in filters and oversampling Δ-Σ converters.

FIG. 1 shows a block diagram of a prior art circuit representing a switched-capacitor amplifier which is in the form of a switched-capacitor integrator. An operational amplifier 3 has an inverting input terminal 4, a non-inverting input terminal 5, and an output terminal 6. The output terminal 6 is connected to the inverting input terminal 4 via a capacitor 7. A signal input 8 of the amplifier arrangement according to FIG. 1 is connected via a first switch 9, a series capacitor 10, and a second switch 11 to inverting input 4. Both electrodes of series capacitor 10 are connected to ground via a respective switch 12, 13. The same configuration comprising a series connection of a switch 14, a load capacitor 15 and a switch 16, as well as two switches to ground 17, 18, is arranged between output terminal 6 and signal output 20 of the amplifier arrangement. During a first clock phase 1, switches 9 and 13 are closed to charge the series capacitor 10. In a second clock phase 2, switches 9 and 13 are opened while switches 11 and 12 are closed, thus providing an amplifying phase in which the operational amplifier 3 is active, amplifying a signal charged on the capacitor 10, thereby discharging capacitor 10 and charging the load capacitor 15. To charge the load capacitor 15 during the amplifying clock phase, switches 14 and 18 are closed during clock phase 2, while switches 16 and 17 are opened. In the next phase 1, the load capacitor 15 is connected to the output 20 and to ground via switches 16, 17. At the same time, the series capacitor 10 is charged again with the input signal Vin which is provided at the signal input 8.

At the beginning of the amplification phase 2, a feed forward effect is present due to the capacitive feedback network when the SC amplifier switches from sampling mode to amplification mode. Sampling mode denotes the clock phase 1 during which the series capacitor 10 and the load capacitor 15 are connected to the signal input 8 and the signal output 20, respectively. This non-inverting feed forward path is in opposition to the inverting signal path through the operational amplifier 3 and the negative feedback loop. These two signal paths are described in FIG. 2.

The effect of this feed forward is that the output is driven into an opposite direction at the beginning of the amplification phase with respect to the direction of the voltage in which it should move in order to reach its correct settled value. The feed forward causes an undesirable initial condition, which requires an extra correction from the operational amplifier during slewing. The time that the operational amplifier requires for this slewing process is relatively large, leaving less time for linear settling. The result is that the operational amplifier has to be designed with larger current and bandwidth in order to achieve a given level of accuracy at the desired speed. As a consequence, the power and noise performance of the overall circuit deteriorate. The problem described primarily affects discrete time circuits such as switched-capacitor circuits. Of course, the problem can be circumvented by using a larger load capacitance which is large with respect to the feedback and input capacitances. However, a large load capacitance slows down the operational amplifier and requires more power in turn.

FIG. 3 shows the equivalent circuit of FIG. 1 which is true at the start of the amplification phase. The beginning of the amplification phase can be simulated with a step voltage at the input, resulting in a step voltage at the output, due to the action of the feedforward network.

As described in FIG. 4, at the beginning of the amplification phase, the output signal has an undesired peak in the opposite direction. The resulting response is compared to the ideal response desired in the integrator.

SUMMARY OF THE INVENTION

It is an object of the present invention to provide a switched-capacitor amplifier arrangement as well as a method to amplify a signal in which the signal peak at the beginning of the amplification phase is reduced without affecting power consumption or speed of the circuit.

This and other objects are attained in accordance with one aspect of the present invention directed to a switched-capacitor amplifier arrangement comprising a signal input for receiving a signal to be amplified and a signal output for providing an amplified signal. A forward path is connected, on an input side, to the signal input and connected, on an output side, to the signal output. The forward path comprises at least one switched capacitor controlled by a clock signal. The clock signal provides an amplification phase of the forward path and an additional clock phase. The amplification phase is also referred to as an amplification mode, while the additional clock phase is also referred to as a sampling mode. In addition to this, a damping means is connected to the forward path, the damping means being designed for attenuation of a signal peak at the beginning of the amplification phase.

The damping means is effectively connected to the forward path only at the beginning of the amplification phase according to an embodiment.

According to an aspect of the invention, the damping means may effectively be connected to the forward path at the beginning of the amplification phase. The damping means is designed to damp a signal peak which might result from an undesired feed forward effect which is present at the beginning of the amplification phase.

The damping means may comprise a switch which is controlled by a control signal. The control signal may be designed to close the switch of the damping means at the beginning of the amplification phase. During the rest of the amplification phase and during the sampling phase, the switch may be open.

The time interval, which represents the beginning of the amplification phase, may be less than or equal to 10% of the period of the clock signal.

According to another aspect, a damping means can effectively be connected to the forward path for attenuation of a signal peak during a time interval, which is less than or equal to 2% of the period of the clock signal.

The damping means can be connected to an output of the forward path.

The forward path may comprise a differential amplifier.

The forward path may comprise an operational amplifier.

The forward path may comprise an integrator.

According to another aspect, the forward path may comprise a differential amplifier connected in a manner to provide a switched-capacitor integrator.

The damping means, according to another aspect of the invention, may comprise an impedance which is effectively connected between the signal output of the amplifier arrangement and a reference potential terminal, at the beginning of the amplification phase.

The impedance may comprise or may be formed by a capacitor.

The impedance may comprise or may be formed by a closed switch.

The damping means may comprise a switch for effectively connecting the impedance to the signal output, at the beginning of the amplification phase.

According to an aspect of the invention, the switched-capacitor amplifier arrangement may be designed to process and to amplify a single-ended signal.

According to another aspect of the invention, the arrangement may be designed for processing of a differential signal.

Instead of or in addition to the damping means comprising an impedance effectively connected between the signal output and a reference potential terminal, the damping means may comprise a bypass path connected between the signal input and the signal output of the amplifier arrangement.

Preferably, the bypass path processes an input signal in a non-inverting manner, while the forward path of the amplifier arrangement has signal-inverting properties. The damping means in the bypass path again is effectively connected preferably at the beginning of the amplification phase.

Another aspect of the invention is directed to a method to amplify a signal comprises the steps of amplifying a signal in a forward path using a switched capacitor technique and attenuating a peak at the beginning of a signal amplification phase by connecting a damping means to the forward path effectively at the beginning of the amplification phase.

According to an aspect of the invention, the damping means can effectively be connected to the forward path during a time interval which is less than or equal to 10% of the period of the clock signal which controls a capacitor driven in a switched-capacitor technique, the capacitor being comprised by the forward path.

The clock signal may comprise a sampling phase followed by an amplification phase, periodically, according to an aspect of the invention.

According to another aspect of the invention, the damping means can effectively be connected to the forward path during a time interval which is less than or equal to 2% of the period of the clock signal which controls the capacitor driven in switched-capacitor technique, the capacitor being comprised by the forward path.

According to another aspect of the method presented, the signal not only is amplified but also can be integrated in the forward path.

According to yet another aspect, an impedance can be effectively connected between a signal output of the amplifier arrangement and a reference potential terminal at the beginning of the amplification phase.

During the rest of the amplification phase and also during the sampling phase, the damping means preferably is disconnected.

A capacitor may be effectively connected between a signal output of the amplifier arrangement and a reference potential terminal, at the beginning of the amplification phase, according to another aspect of the invention.

According to additional aspects, the method may be realized amplifying a single-ended signal in the forward path or amplifying a differential signal in the forward path.

According to another aspect of the invention, a bypassing of a signal to be amplified is provided in a non-inverting manner with respect to the forward path and is superimposed with an amplified signal which is processed in an inverting manner, provided at an output of the forward path, at the beginning of the amplification phase.

DETAILED DESCRIPTION OF THE DRAWINGS

Figure 5:
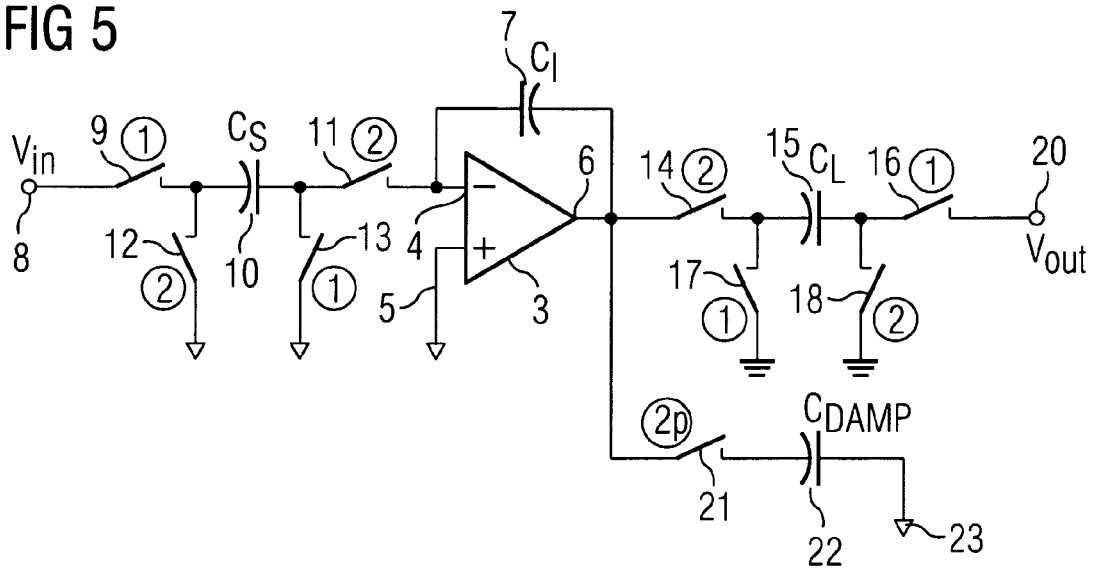
FIG. 5 shows an exemplary embodiment of an arrangement according to the invention.

FIG. 5 shows an example of a switched-capacitor amplifier arrangement being designed as a switched-capacitor integrator. With respect to the devices, their interconnections as well as the basic functional aspects of a switched-capacitor technique, the arrangement according to FIG. 5 widely corresponds to the arrangement as presented and already described in FIG. 1. To avoid redundancy, the description is not repeated here. In addition to the circuitry of FIG. 1, the arrangement of FIG. 5 has a damping means comprising a switch 21 and a damping capacitor 22. The switch 21 and the damping capacitor 22 are connected to each other in a series configuration and arranged between the output terminal 6 of the operational amplifier 3 and a ground potential terminal 23.

The arrangement according to FIG. 5 makes use of a damping network which is momentarily connected to the output of the operational amplifier 6 just at the start of the amplification phase 2 when the feed forward effect is worst and is immediately removed after this short interval allowing the amplifier 6 to slew and settle with its normal load alone. The damping means comprises, in this example, a relatively large capacitor 22. As the transients are quite fast, the use of a damping capacitor provides a relatively uniform performance. The circuit requires additional components and very simple logic but provides significant improvement in the slew requirements, thereby allowing design of switched-capacitor circuits with lower current and noise for a given speed requirement.

As the circuit arrangement proposed is quite general, it may be combined with other arrangements that allow enhanced slew speeds in order to achieve optimum performance levels. Furthermore, the proposed arrangement does not require changing any of critical parameters of a circuit such as a feedback network, etc. which are normally limited by other constraints. Moreover, the additional circuitry does not introduce any noise into the signal path due to reasons which are described later.

The principle proposed helps to improve the power-speed-noise trade-off which can be quite critical in analog integrated circuit design. Temporarily, a damping network is used which suppresses the effect of the feed forward. According to calculations made, the slew requirements may be reduced significantly using this approach. The exact amount of improvement with respect to the signal peak depends on many factors such as the feedback network of the amplifier to which the principle is to be applied, the available die area, etc. In most cases, the slew current required can be reduced by about 50% using the principle proposed.

Figure 6:
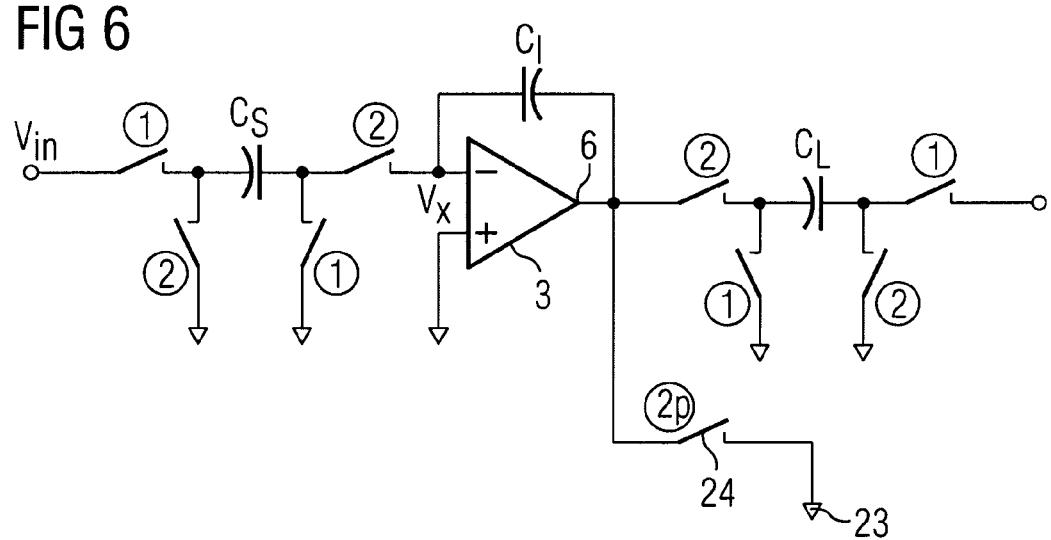
FIG. 6 shows another exemplary embodiment of a circuit according to the invention.

FIG. 6 shows an alternative, exemplary embodiment with respect to FIG. 5. Due to the fact that the circuits of FIGS. 5 and 6 widely are the same with respect to the devices used, their advantageous interconnections and their functional aspects, a repetition is avoided here. Instead of the damping means comprising a switch 21 and a damping capacitor 22, the circuit according to FIG. 6 only uses a switch 24 which directly connects the output 6 of the operational amplifier 3 to a ground potential terminal 23. The switch 24 is designed as a low-resistance switch.

Figure 7:
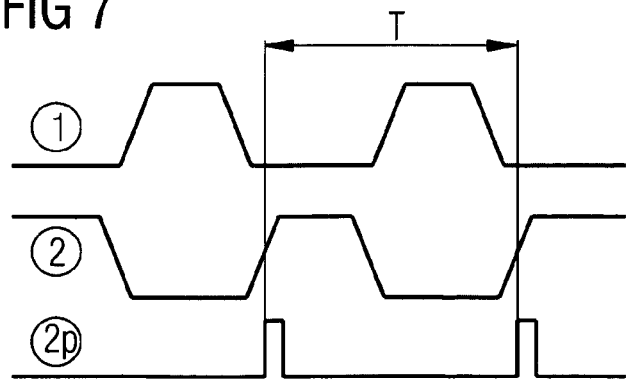
FIG. 7 shows diagrams of the control signals to be applied to the circuits of FIGS. 5 and 6, as an example.

With respect to FIG. 7, timing diagrams for the switches in FIGS. 5 and 6 are presented. The reference numeral 1 refers to a signal, which controls the switches 9, 13, 17 and 16 of FIGS. 5 and 6. When signal 1 is high, the respective switches are closed. The respective switches are open when signal 1 is low. The signal $2p$ refers to the signal which controls the switch 21 of FIG. 5 and the switch 24 of FIG. 6, respectively, namely the damping means function. The signal $2p$ must go high at approximately the same time as the start of the amplification phase. In this example, the signal $2p$ is high during a time interval which is approximately 5% of the total clock period t of the periodic signals 1, 2, $2p$.

Figure 8:
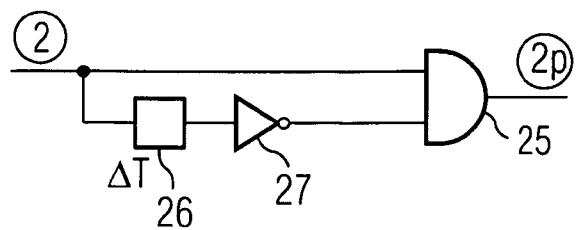
FIG. 8 shows an example to generate the additional control signal which can be applied in the circuits of FIGS. 5 and 6.

FIG. 8 shows an example of a circuit which allows the generation of the signal $2p$ easily. It comprises a logic AND gate 25, the output of which provides the signal $2p$. While one input of the AND gate 25 is directly connected to the signal 2, the other one comprises a series configuration of a delay device 26 and an inverter 27.

In the practical implementations according to FIGS. 5 and 6, the load capacitance is temporarily boosted at the start of the amplification phase through addition of a large damping capacitance 22. This capacitance may be connected for just a very short time, for example less than 10%, 5%, or 2% respectively of the clock period. The function is primarily to suppress the feed forward which is worst at the start of the phase when the negative feedback has not effectively started yet. The suppression of the feed forward reduces the slew time, allowing more time for the operational amplifier to settle. The feed forward effect becomes almost negligible when the net load capacitance is about four to five times higher than the series combination of the sampling and feedback capacitances 7, 10. The net load capacitance is the sum of the load capacitance 15 and the damping capacitance 22, if applicable. However, the exact value of the damping capacitance 22 could be determined by simulation. An even more area efficient way to damp the load impedance is to short the output of the operational amplifier to a signal (AC) ground for a short while at the start of the amplification phase. As shown in FIG. 6, this may be done by using a simple switch or transmission gate 24. This is very practical in case the required damping capacitor is too large. The use of a capacitor primarily helps in rendering the suppression scheme more uniform and avoids any problems that could occur when trying to match the impedance of a resistive element to that of a capacitive element. However, the use of a sufficiently large switch 24 is sufficient in most cases.

Figure 9:
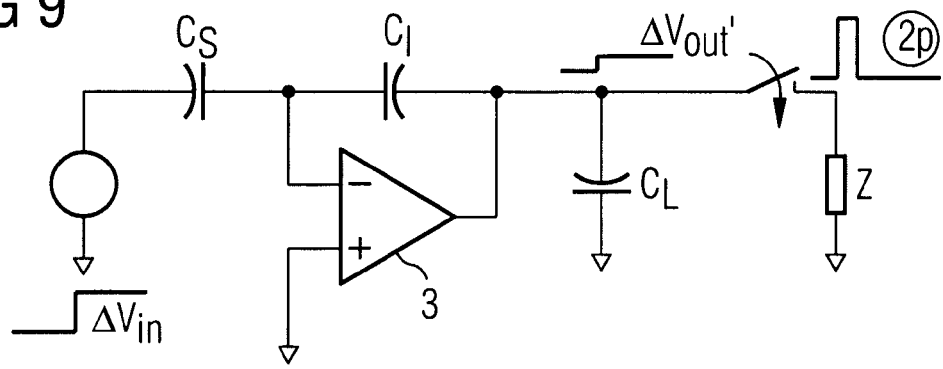
FIG. 9 shows an equivalent circuit to the circuit of FIG. 5, at the beginning of the amplification phase.

FIG. 9 illustrates an example of the concept behind the embodiments of FIGS. 5 and 6. A damping load Z is momentarily connected to the output of the operational amplifier 3 at the start of the amplification phase. As explained above, this can be a large switch in order to provide a low impedance from the operational amplifier output to a suitable AC ground, preferably the analog ground voltage of the circuit. The use of an extra resistance is not necessary in most cases as every real switch has a finite resistance. However, if better control of the damping impedance is desired, then a resistance or capacitance can be used. For fully differential circuits, in alternative embodiments, this damping capacitor or switch or other suitable damping network may be connected directly between the two differential outputs of the operational amplifier, which is even more area efficient, and leads to a four-fold savings in area compared to the case where separate damping networks are connected from each differential output to AC ground. This also has the merit of not disturbing the common-mode voltages of the circuit.

Figure 10:
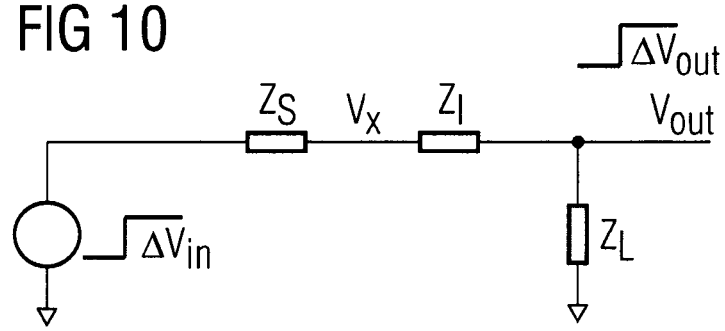
FIG. 10 shows an example of the feed forward mechanism in the impedance domain.

FIG. 10 illustrates the feed forward phenomena in the impedance domain. The goal is to reduce the load impedance ZL with respect to the sum of the series impedance and the feedback impedance ZS, ZI. This can be either done by lowering the load impedance ZL momentarily, or by raising the series configuration impedance, which is the sum of the series impedance ZS and the feedback impedance ZI, momentarily.

Figure 11:
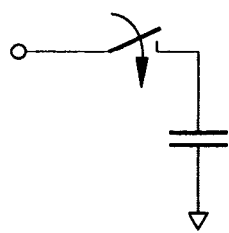
FIG. 11 shows an alternative example for the switchable damping impedance which can be applied in the circuits of FIGS. 5 and 9.
Figure 12:
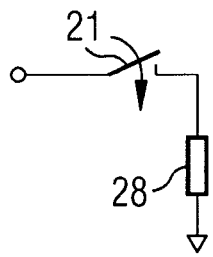
FIG. 12 shows another damping impedance to be applied at the circuits of FIGS. 5 and 9 as an example.
Figure 13:
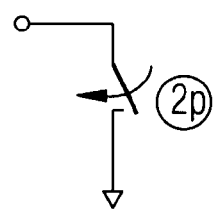
FIG. 13 shows another example of a damping means using a low resistance switch.

FIG. 11 shows a further example of a damping means which can be applied to the circuits of FIGS. 5 and 6. As shown in FIG. 11, the damping means may comprise a switch and a series capacitor for damping. As an alternative, it is also possible to use a small resistance 28 as shown in FIG. 12 in series to a switch 21. As shown in FIG. 6, a switch can be used to directly connect the amplifier output to ground, compare FIG. 13.

Figure 1:
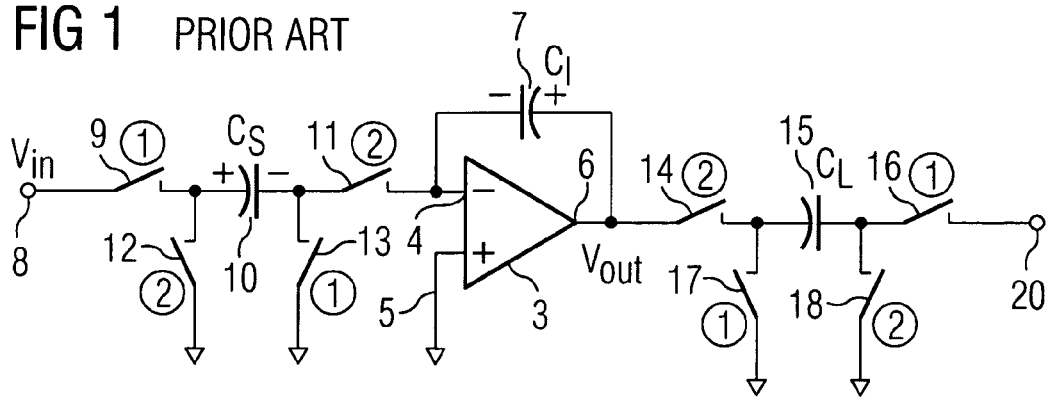
FIG. 1 shows a switched-capacitor amplifier according to prior art.
Figure 2:
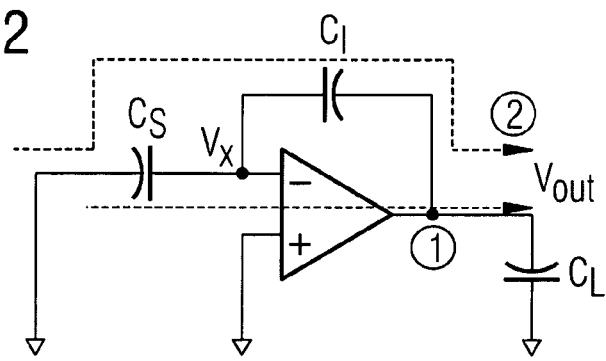
FIG. 2 shows a feed forward effect.
Figure 3:
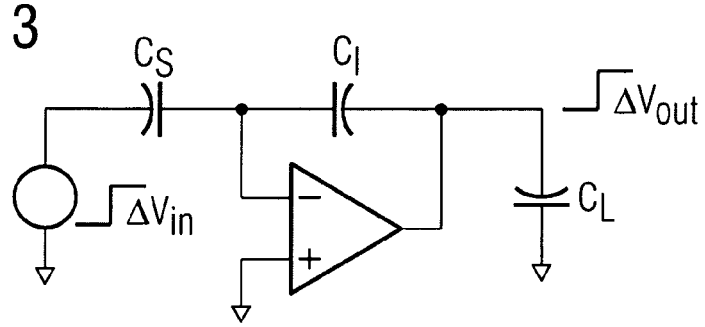
FIG. 3 shows an equivalent circuit representing the start of the amplification mode of the circuit of FIG. 1.
Figure 4:
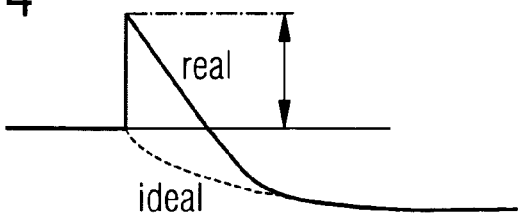
FIG. 4 shows a signal peak at the beginning of the amplification phase of the circuit of FIG. 1.
Figure 14:
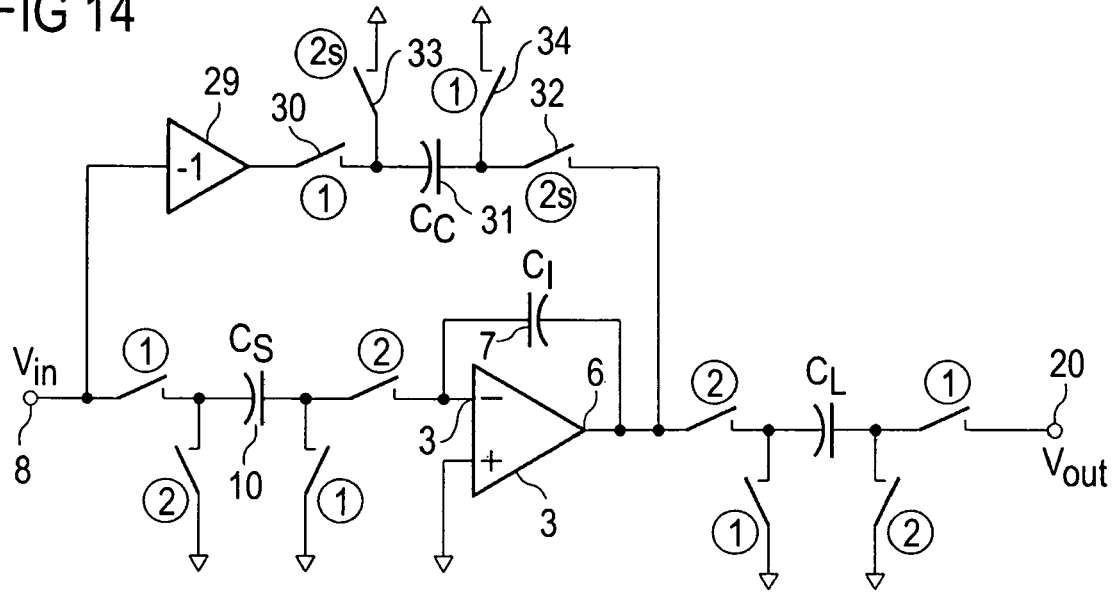
FIG. 14 shows an example of an arrangement according to principle presented using a bypass path.

FIG. 14 shows an example of an alternative embodiment of the proposed arrangement. Instead of using an additional impedance connecting the output of the amplifier to ground momentarily at the beginning of the amplification phase, FIG. 14 shows the use of an additional feed forward path, which is referred to as a bypass. By doing this, a feed forward cancellation can be achieved. The circuit of FIG. 14 comprises the devices and interconnections as shown in FIG. 1. In addition to this, a bypass path is provided connecting the signal input 8 to the output 6 of the amplifier 3. The bypass path comprises an inverter 29 connected in series to a switch 30, a compensation capacitor 31, and an additional switch 32. Both electrodes of the capacitor 31 have an additional switch 33, 34 connected to a reference potential terminal respectively. In conclusion, the configuration comprising the two series switches 30, 32, the compensation capacitor 31, and the two additional switches 33, 34 has a circuit structure which is the same as with the switched-capacitor arrangements which are connected between the signal input 8 and the inverting input 4 of the amplifier 3, as well as the arrangement connecting the output 6 to the signal output 20, respectively. However, the additional circuitry in the bypass path has a different timing, as further described below.

Figure 15:
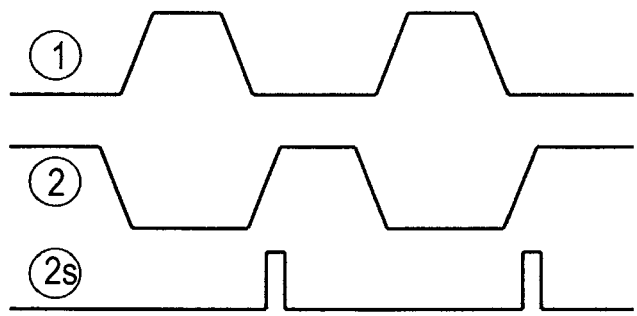
FIG. 15 shows examples of control signals to be applied at the circuit of FIG. 14.

FIG. 15 shows an example of the signal diagrams that control the switches of the circuit arrangement as presented in FIG. 14. In addition to the conventional signals 1 and 2 that control the conventional switched-capacitor switches, an additional signal 2s is provided. The signal 2s controls the switches 33 and 32 in the bypass path, whereas the switches 30 and 34 are controlled by control signal 1.

The value of the compensation capacitor 31 is laid out to be a product of the series capacitor 10 and the feedback capacitor 7, divided by the sum of the series capacitor 10 and the feedback capacitor 7.

Figure 16:
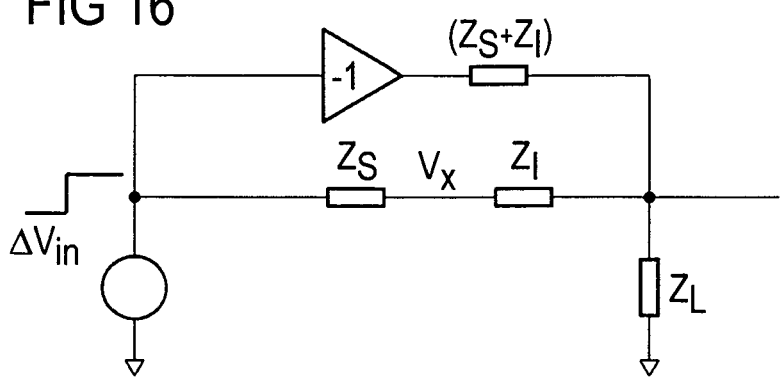
FIG. 16 shows the concept behind the example of the bypass cancellation presented in FIG. 14.

FIG. 16 illustrates an example of the concept behind the feed forward cancellation scheme as presented in FIG. 14. In fully differential circuits, the inverter 29 can be realized very easily by using the complementary differential signal which inherently has the reverse polarity.

The principle behind the circuits according to FIGS. 14 to 16 has the advantage that it can accomplish practically perfect feed forward cancellation. The feed forward component is cancelled out by placing a bypass path which has the same impedance as the feed forward path in parallel to it, but applying a signal with has opposite polarity to that applied to the normal forward path. This causes the feed forward path to be practically open-circuited and eliminates feed forward completely. Of course, this principle is applied only at the beginning of the amplification phase as well. As the cancellation capacitor 31 represents a series combination of the capacitors in the feed forward branch, it is smaller than both of them each, thus saving area. This proposal allows nearly ideal response in switched-capacitor circuits. In case a capacitor mismatch would occur between the two forward branches, the cancellation would not be perfect. However, it will still be quite good and offers significant benefits. In addition to this, capacitor mismatch in modern complementary metal oxide semi-conductor, CMOS processes, in which the suggested circuits could be integrated, is very low. As already explained in FIG. 14, a cancellation capacitor 31 is connected between the input 8 and the output 6 for a short time at the start of each amplification phase.

Figure 17:
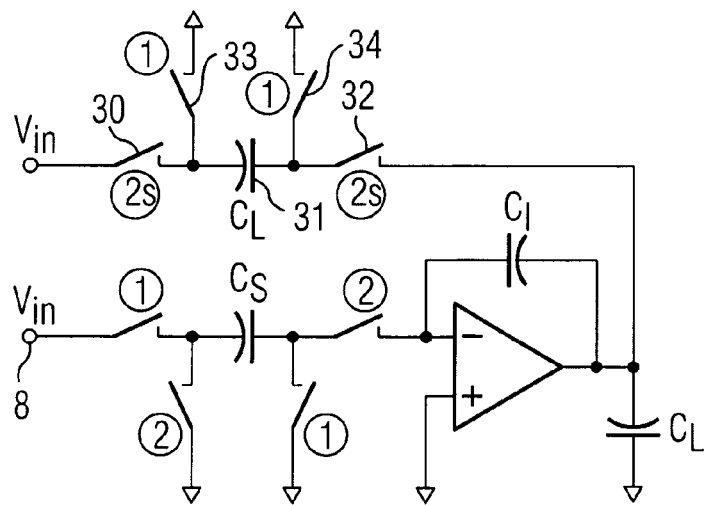
FIG. 17 shows an exemplary implementation of the scheme presented in FIG. 14 as an example.

FIG. 17 shows an alternative, exemplary embodiment with respect to the circuit of FIG. 14. In both cases, a bypass path is provided. The circuit of FIG. 17 is identical to the one in FIG. 14. However, the inverter 29 is omitted in FIG. 17. Instead, the input terminal of switch 30 is directly subject to the input signal Vin, which is also applied to the signal input 8 of the arrangement. It is important to note that the switching and timing diagram of the switched-capacitor compensation arrangement 30, 31, 32, 33, 34 comprising the compensation capacitor 31 as well as four switches, is completely different to the one presented in FIG. 14. In FIG. 17, switches 30 and 32, which are the two series switches, are controlled by the additional control signal 2s, while the two switches 33, 34 connected to a reference potential are controlled by signal 1. It is referred to FIG. 15 for the signal plans and timing. In FIG. 17, it can be seen that the feed forward neutralization capacitor 31 presents a load to the preceding stage for only a short while during which it is connected to the signal input 8. An interesting point to observe is that the inverted input signal is not required in this example, suggesting that the scheme may also be applied to single-ended circuits. However, the inverted input signal is typically used in other fully differential switched-capacitor circuits. In single-ended circuits, this scheme may also be implemented by switching the feed forward cancellation branch in an orthogonal fashion to the input branch. Thus, a non-inverting input branch may be compensated for by using an inverting feed forward cancellation branch, and vice-versa. The inverted input signal is thus realized using switching.

It is an advantage of the circuit of FIG. 17 that no capacitor for damping and/or cancellation is connected to the virtual ground of the operational amplifier. For this reason, no errors are introduced in the signal path and do not participate in the charge-transfer process. Charge-injection and thermal noise from switching of these capacitors cannot cause any problems. Compared to a conventional switched-capacitor arrangement, the proposed principle needs only very little more chip area. At the same time, power, noise and speed performance are improved.

Figure 18:
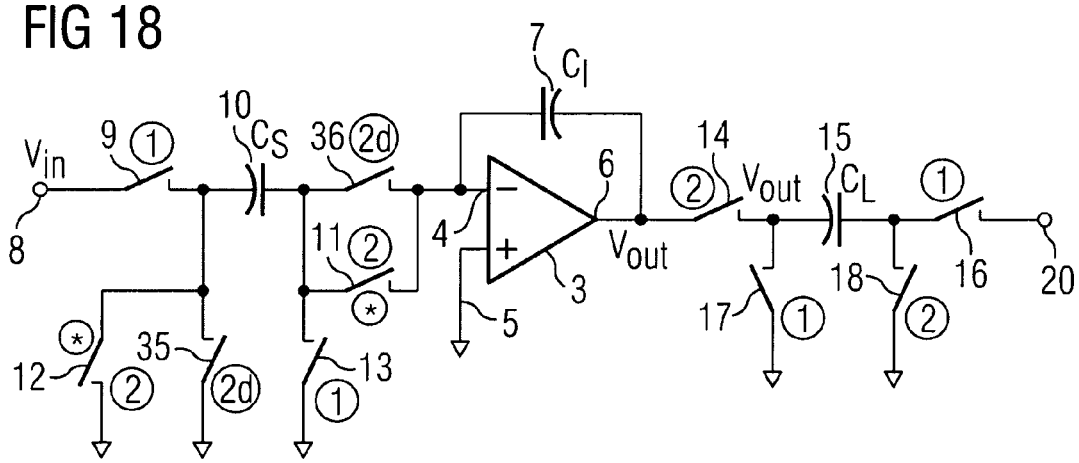
FIG. 18 shows another example of an arrangement according to the principle presented using high resistive switches.

Yet another embodiment of the principle of peak cancellation is shown in FIG. 18. The circuit shown in FIG. 18 is based on the circuit as shown in FIG. 1. As far as the circuits shown in FIGS. 1 and 18 are the same, the description is not repeated to avoid redundancy. In addition to this, a further switch 35 is connected in parallel to switch 12, therefore being connected between an input side of the series capacitor 10 and ground. Further on, an additional switch 36 is connected in parallel to switch 11, therefore connecting another electrode of capacitor 10 to the inverting input 4 of the operational amplifier 3. The two additional switches 35, 36 have a timing signal 2d of their own.

Figure 19:
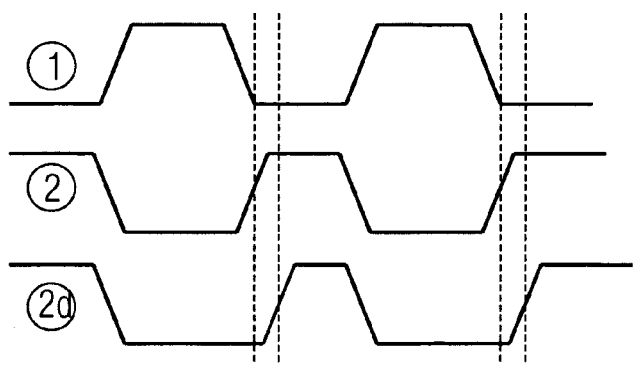
FIG. 19 shows examples of diagrams of control signals to be applied at the circuit of FIG. 18.

FIG. 19 shows an example of the timing diagrams applicable to the circuit of FIG. 18. Switches 9, 13, 17, and 16 are controlled by control signal 1. Switches 11, 12, 14, and 18 are controlled by control signal 2, which is displayed in the middle of FIG. 19. The lower part of FIG. 19 shows an additional control signal 2d. Compared to control signal 2, the rising edge of the signal 2d is delayed a little bit. The timing of the falling edge is identical to the one of signal 2. The additional switches 35 and 36 are controlled by the additional control signal 2d. The switches 11 and 12 are designed as high-resistive switches in FIG. 18. All the other switches shown in FIG. 18 are normal switches.

In conclusion, at the start of the amplification phase, high-resistive switches are used, which also allows a realization, as an example, of the principle proposed.

Figure 20:
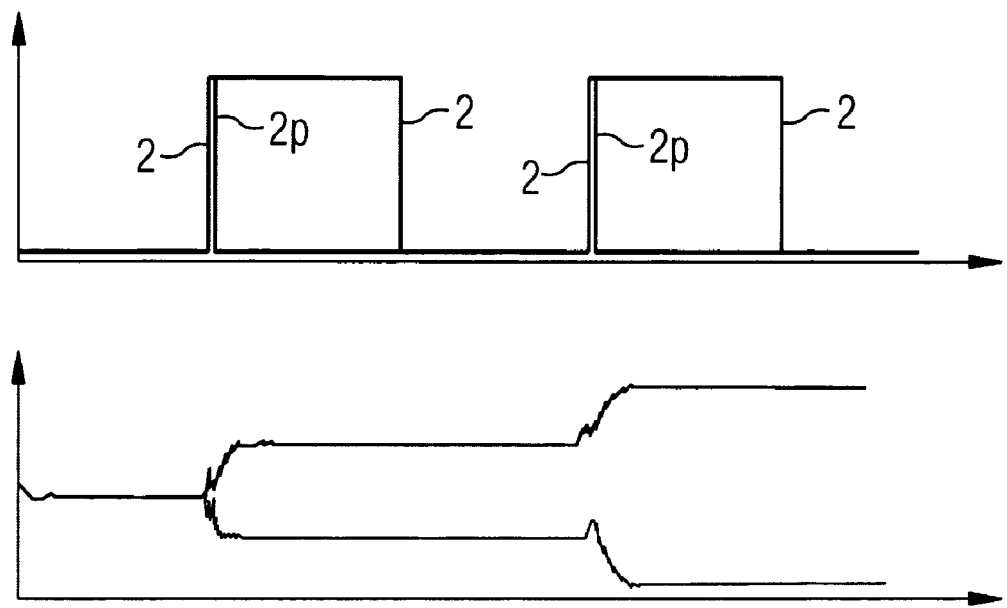
FIG. 20 shows a signal occurring with an arrangement according to an embodiment of the invention.

FIG. 20 shows a simulation result of the principle proposed. In the upper part, the control signals 2 and 2p as shown in FIG. 7 are described. In the lower part, the settling behavior of an operational amplifier having a feed forward cancellation according to the principle proposed is shown. It is obvious from FIG. 20 that after a brief transient, the output of the operational amplifier settles almost ideally. The slew time is reduced significantly compared to the case where the undesired feed forward effect is present, compare FIG. 21.

Figure 21:
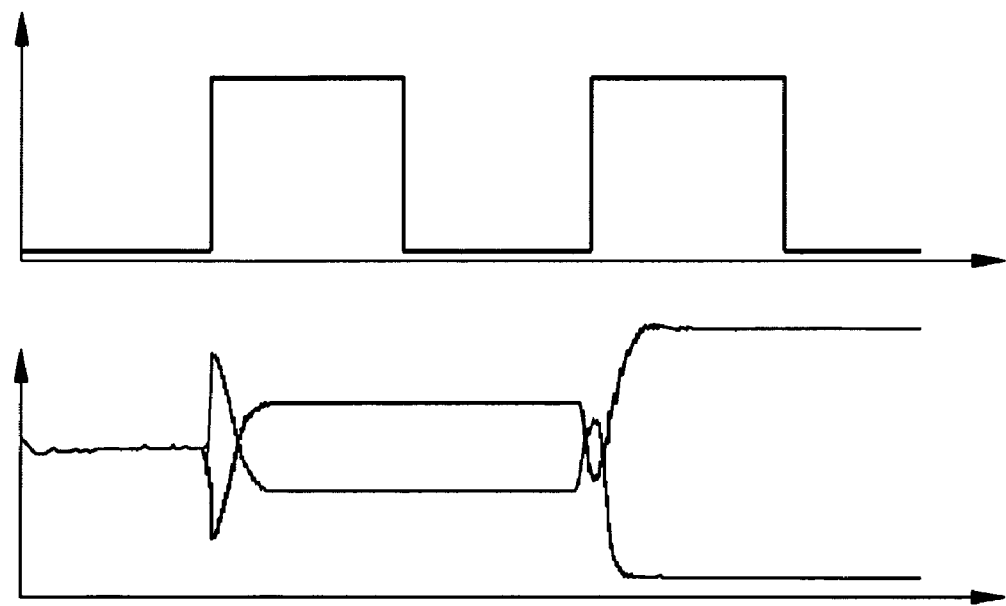
FIG. 21 shows selected signals occurring with a switched-capacitor arrangement without feed forward cancellation.

FIG. 21 shows the disadvantageous settling behavior without feed forward cancellation, as present with the circuit of FIG. 1. From the lower part of FIG. 21, it can be seen that the operational amplifier output jumps in the wrong direction at the start of the integration or amplification phase. The slew time is increased greatly compared to the ideal case.

The proposed concept may be used with any switched-capacitor circuit or even any discrete-time circuit which suffers from the conflict of feed forward and feedback paths. In order to avoid this conflict, it is suggested that the load impedance is lowered temporarily with respect to the feed forward branch series impedance. Continuous-time, CT circuits typically do not suffer from the feed forward effect owing to an ever-present negative feedback loop which is never open. Moreover, CT circuits are normally not subject to step responses of the kind mentioned in the present application, and neither do they use clock phases, which may provide timing information for generating the short pulse that is used to connect the damping network or feed forward cancellation network at the beginning of the amplification phase. However, if such a situation arises, even in a CT circuit, the proposed schemes may be used as well. In this case, an edge detection circuitry such as the one presented in this document, or a differentiator may be used to determine when a suitably large step input is applied to the system. The timing generation in this case is essentially asynchronous and needs to be done carefully. In clocked CT circuits, the proposed schemes may be applied directly. This has implications for certain specialized continuous-time circuits such as CT Δ-Σ, Delta-Sigma modulators, where there is a step input from the DAC, digital to analog converter, feedback path.

Generally, where a feed forward effect is a problem, a solution to this problem can be conceived by making use of the principles as shown in FIGS. 10 and 16, for example. Here, the load impedance needs to be lowered temporarily with respect to the feed forward impedance, which is a sum of the series impedance ZS and the integration impedance ZI. This may be accomplished either by adding a damping impedance in series with the feed forward impedance, or in parallel with the load impedance for a short time at the start of the amplification phase. Alternatively, one may attempt to cancel out the feed forward path itself.

Preferably, the circuits proposed may be integrated in complementary metal oxide semi-conductor, CMOS circuitry. However, any other integration technique is suitable as well, depending on the application.

The invention claimed is:

1. A switched-capacitor amplifier arrangement, comprising:
   a signal input for receiving a signal to be amplified;
   a signal output for providing an amplified signal;
   a forward path connected between the signal input and the signal output and having at least one switched capacitor controlled by a clock signal, thus providing an amplification phase of the forward path and an additional clock phase; and
   an impedance coupled to the forward path only at a beginning of the amplification phase for attenuation of a signal peak at the beginning of the amplification phase, said impedance being coupled between a signal output of the amplifier arrangement or an output of an amplifier in the forward path, and a reference potential terminal, at the beginning of the amplification phase.

2. The arrangement according to claim 1, wherein the impedance is coupled to the forward path, for attenuation of a signal peak, during a time interval which is less than or equal to 10% of the period of the clock signal.

3. The arrangement according to claim 1, wherein the impedance is coupled to the forward path, for attenuation of a signal peak, during a time interval which is less than or equal to 5% of the period of the clock signal.

4. The arrangement according to claim 1, wherein, the forward path comprises a differential amplifier connected in a manner to provide a switched-capacitor integrator.

5. The arrangement according to claim 1, wherein the impedance comprises a capacitor.

6. The arrangement according to claim 1, wherein the impedance comprises a switch for coupling the impedance to the signal output, at the beginning of the amplification phase.

7. The arrangement according to claim 1, wherein the arrangement is adapted for processing of a single-ended signal.

8. A switched-capacitor amplifier arrangement, comprising:
   a signal input for receiving a signal to be amplified;
   a signal output for providing an amplified signal;
   a forward path connected between the signal input and the signal output and having at least one switched capacitor controlled by a clock signal, thus providing an amplification phase of the forward path and an additional clock phase; and
   a bypass path coupled to the forward path only at a beginning of the amplification phase for attenuation of a signal peak at the beginning of the amplification phase, the bypass path being coupled between the signal input and the signal output in a non-inverting manner with respect to the forward path which is signal inverting, at the beginning of the amplification phase.

9. The arrangement according to claim 8, wherein the arrangement is adapted for processing of a differential signal.

10. A method to amplify a signal, comprising the steps of amplifying a signal in a forward path using a switched-capacitor technique; and
    attenuating a peak at a beginning of a signal amplification phase by connecting a damping means to the forward path;
    wherein said connecting the damping means comprises coupling an impedance between a signal output of an amplifier arrangement or an output of an amplifier comprised by a forward path, and a reference potential terminal, at the beginning of the signal amplification phase.

11. The method according to claim 10, further comprising the step of:
    coupling the damping means to the forward path during a time interval which is less than or equal to 10% of a period of a clock signal which controls at least one capacitor driven in the switched-capacitor technique, the at least one capacitor comprised by the forward path.

12. The method according to claim 10, further comprising the step of:
    coupling the damping means to the forward path during a time interval which is less than or equal to 5% of a period of a clock signal which controls at least one capacitor driven in the switched-capacitor technique, the at least one capacitor comprised by the forward path.

13. The method according to claim 10, further comprising the step of:
    integrating the signal in the forward path.

14. The method according to claim 10, further comprising the step of:
    coupling a capacitor between a signal output of the amplifier arrangement or an output of the amplifier and the reference potential terminal, at the beginning of the amplification phase.

15. The method according to claim 10, further comprising the step of:
    amplifying a single-ended signal in the forward path.

16. The method according to claim 10, further comprising the step of:
amplifying a differential signal in the forward path.

17. A method to amplify a signal, comprising the steps of:
amplifying a signal in a forward path using a switched-capacitor technique; and
attenuating a peak at a beginning of a signal amplification phase by connecting a damping means to the forward path;
wherein said connecting the damping means comprises bypassing a signal to be amplified in a non-inverting manner with respect to the forward path and superimposing with an amplified signal provided in a signal-inverting manner at an output of the forward path, at the beginning of the amplification phase.

* * * * *